United States Patent
Kim et al.

(10) Patent No.: US 11,320,483 B2
(45) Date of Patent: May 3, 2022

(54) METHOD FOR TESTING DEVICE UNDER TEST AND APPARATUS USING THE SAME

(71) Applicant: PhosPhil Inc., Seoul (KR)

(72) Inventors: Byung Kyu Kim, Yongin-si (KR); Byeong Yun Kim, Seoul (KR)

(73) Assignee: PHOSPHIL INC., Seoul (KR)

( * ) Notice: Subject to any disclaimer, the term of this patent is extended or adjusted under 35 U.S.C. 154(b) by 0 days.

(21) Appl. No.: 16/984,360

(22) Filed: Aug. 4, 2020

(65) Prior Publication Data

US 2021/0255241 A1 Aug. 19, 2021

(30) Foreign Application Priority Data

Feb. 13, 2020 (KR) .......................... 10-2020-0017354

(51) Int. Cl.
  *G01R 31/3177* (2006.01)
  *G01R 31/317* (2006.01)
  *G01R 31/34* (2020.01)

(52) U.S. Cl.
  CPC ... *G01R 31/3177* (2013.01); *G01R 31/31703* (2013.01); *G01R 31/31727* (2013.01)

(58) Field of Classification Search
  None
  See application file for complete search history.

(56) References Cited

U.S. PATENT DOCUMENTS

| | | | | |
|---|---|---|---|---|
| 6,016,565 A | * | 1/2000 | Miura | G01R 31/31937 714/736 |
| 6,378,098 B1 | * | 4/2002 | Yamashita | G01R 31/31917 714/742 |
| 6,990,423 B2 | * | 1/2006 | Brown | G01R 31/31703 702/116 |

(Continued)

FOREIGN PATENT DOCUMENTS

JP 2014016196 A 1/2014
KR 1020100085390 A 7/2010

OTHER PUBLICATIONS

Raj et al., Fault scanning and repairing in processor based system using dynamic reconfiguration, IEEE, Conference Paper, pp. 120-124. (Year: 2013).*

(Continued)

*Primary Examiner* — April Y Blair
*Assistant Examiner* — Dipakkumar B Gandhi
(74) *Attorney, Agent, or Firm* — Cantor Colburn LLP

(57) ABSTRACT

Provided is a test apparatus for testing a device under test (DUT), the apparatus operating at an operating frequency that is lower than an operating frequency of the DUT. The test apparatus includes a clock source which generates a clock according to the operating frequency of the test apparatus, a clock multiplier configured to multiply the generated clock source by a multiplication number which is set according to the operating frequency of the DUT and output a first clock for the DUT, a phase converter configured to shift a phase of the generated clock according to the (Continued)

multiplication number and output a plurality of second clocks having different phases, and a test pattern comparator configured to sequentially collect pieces of data from the DUT by sequentially applying the plurality of second clocks having different phases.

4 Claims, 6 Drawing Sheets

(56) References Cited

U.S. PATENT DOCUMENTS

| | | | |
|---|---|---|---|
| 7,240,269 B2* | 7/2007 | Ochi | G01R 31/31922 713/401 |
| 2004/0044492 A1 | 3/2004 | Ichikawa | |
| 2004/0163021 A1* | 8/2004 | Nadeau-Dostie | G01R 31/31858 714/726 |
| 2005/0210341 A1* | 9/2005 | Chiba | G01R 31/31924 714/701 |
| 2007/0047337 A1* | 3/2007 | Iizuka | G11C 29/02 365/193 |
| 2007/0203659 A1* | 8/2007 | Yamaguchi | G01R 31/31709 702/69 |
| 2013/0305106 A1* | 11/2013 | Mittal | G01R 31/318536 714/E11.155 |
| 2016/0178695 A1* | 6/2016 | Zhang | G01R 31/318555 714/727 |

OTHER PUBLICATIONS

Karimi et al., Testing of Clock-Domain Crossing Faults in Multi-core System-on-Chip, IEEE, Conference Paper, pp. 7-14 (Year: 2011).*

* cited by examiner

METHOD FOR TESTING DEVICE UNDER TEST AND APPARATUS USING THE SAME

BACKGROUND

1. Technical Field

The present invention relates to a measurement method and a measurement apparatus for testing a device under test (DUT). More particularly, the present invention relates to a measurement method and a measurement apparatus for testing a DUT operating at a relatively high speed clock through a test apparatus operating at a relatively low speed clock.

2. Description of Related Art

Generally, in order to test high-speed semiconductor devices such as double data rate (DDR) memories, network integrated circuits (ICs), processors, and the like, a high-speed test apparatus having an operating speed corresponding to operating speeds of the high-speed semiconductor devices is required. However, speeding up a test apparatus inevitably acts as an economic burden. In particular, the speeding up acts as a heavy burden in testing semiconductor devices in small and medium-sized enterprises which are hardly provided with expensive test apparatuses.

According to a related art, in order to overcome such a burden of expenses, a test method using a test apparatus which is relatively slower than a device under test (DUT) has been disclosed in U.S. Patent Application Publication No. 2004/0044492.

The test method according to the related art has a structure in which, after two pattern generators alternately generate pieces of test data, the pieces of test data are synthesized through a multiplexer to be output to a memory which is the DUT, or pieces of data are received from the memory and transmitted to a comparator through two channels. Here, since an operating frequency of a pattern generator inside the test apparatus or an input channel uses a clock which is twice slower than the operating frequency of the memory which is the DUT, the two pattern generators are used.

Such a conventional test method can test the memory operating at a relatively high speed even with the test apparatus operating at a relatively low speed. However, there is a problem in that the test apparatus becomes too large according to performance of the memory.

In the case of the above described example, since the operating frequency of the test apparatus is twice slower than the operating frequency of the memory which is the DUT, the test apparatus can be implemented with only two pattern generators. However, in particular, in order to perform a multi-division test, such as 4-division, 8-division, or the like, on a network interface device in features of an ultra-high-speed serial data output, there is a problem in that the test apparatus becomes larger.

In other words, according to the related art, there is a problem in that an additional pattern generator is inevitably required in the test apparatus so as to test a faster memory and thus the test apparatus continuously becomes larger inevitably and costs inevitably rise as well. In addition, there is even a problem in that the test apparatus cannot perform a test with respect to various operating frequencies.

SUMMARY

1. Technical Problem

A technical objective of the present invention is to allow an enterprise to perform a test on a high-performance device under test (DUT) even using the existing low-performance test apparatus, wherein the enterprise hardly prepares a test apparatus according to performance of the DUT although performance of the DUT is gradually improved.

2. Solution to Problem

A characteristic configuration of the present invention for achieving the above described objectives of the present invention and realizing characteristic effects of the present invention, which will be described below, is as follows.

The present invention relates to a test apparatus for testing a device under test (DUT), the test apparatus operating at an operating frequency that is lower than an operating frequency of the DUT. The test apparatus includes a clock source which generates a clock according to the operating frequency of the test apparatus, a clock multiplier configured to multiply the generated clock by a multiplication number which is set according to the operating frequency of the DUT and output a first clock for the DUT, a phase converter configured to shift a phase of the generated clock according to the multiplication number and output a plurality of second clocks having different phases, and a test pattern comparator configured to sequentially collect pieces of data from the DUT by sequentially applying the plurality of second clocks having different phases.

3. Advantageous Effects

According to the present invention, although a test apparatus operates at an operating frequency that is relatively lower than an operating frequency of a device under test (DUT), the test apparatus can perform a test of the DUT.

Accordingly, the test apparatus according to one embodiment of the present invention can perform a test on a high-performance DUT even at a relatively low cost.

While the present invention has been described with reference to specific items such as particular components, exemplary embodiments, and the accompanying drawings, these are merely provided to aid in understanding the present invention, and the present invention is not limited to these embodiments, and those skilled in the art to which the present invention pertains can variously alter and modify from the description of the present invention.

Therefore, the spirit of the present invention should not be limited to the above-described embodiments, and it should be construed that the appended claims as well as all equivalents or equivalent modifications of the appended claims will fall within the scope of the present invention.

Such equivalents or equivalent modifications will include, for example, methods which are mathematically or logically equivalent and which can produce the same results as implementing the method according to the present invention.

BRIEF DESCRIPTION OF DRAWINGS

The accompanying drawings for use in description of embodiments of the present invention are only a part of the embodiments thereof, and other drawings can be obtained by those skilled in the art to which the present invention pertains (hereinafter referred to as an "ordinary skilled person") based on the accompanying drawings without any inventive work.

DETAILED DESCRIPTION OF EMBODIMENTS

Figure 1:
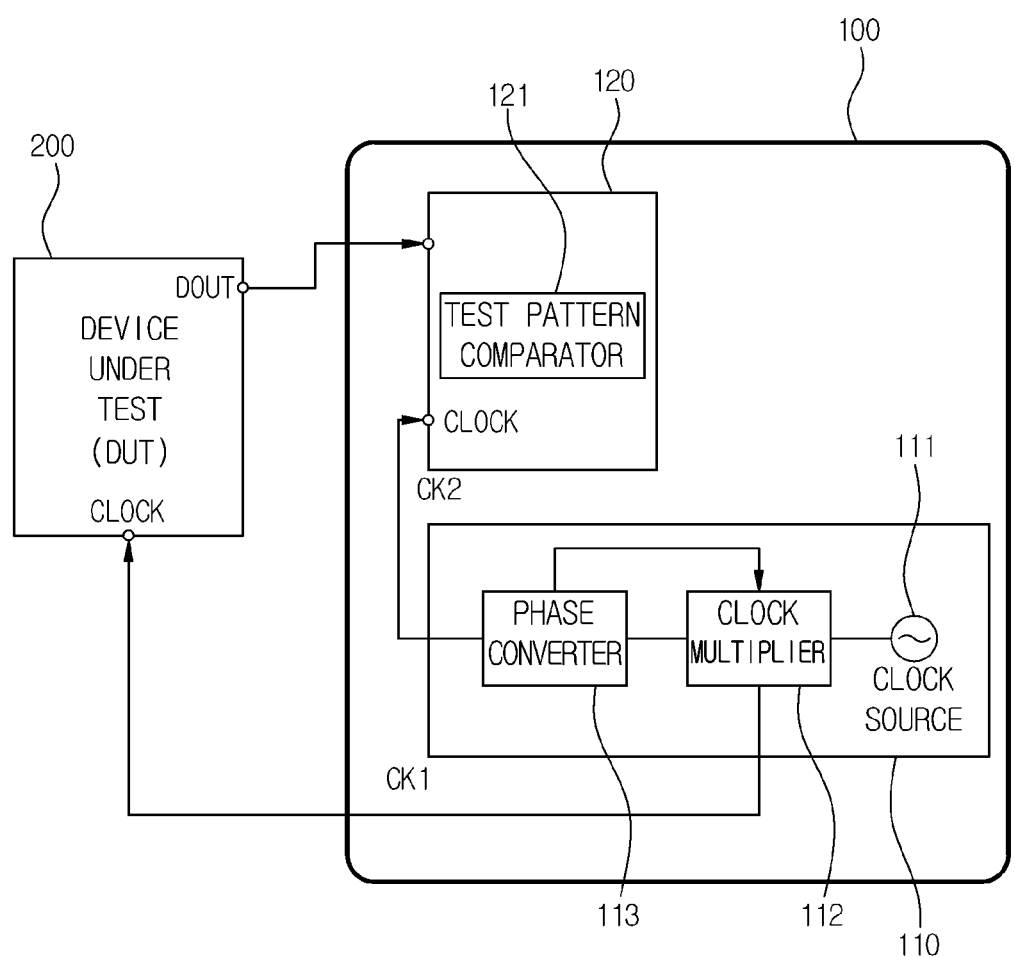
FIG. 1 is a schematic block diagram illustrating a test apparatus and a device under test (DUT) according to one embodiment of the present invention.

The following detailed description of the present invention refers to the accompanying drawings that illustrate, by way of illustration, specific embodiments in which the present invention may be practiced in order to clarify the objectives, technical solutions, and advantages of the present invention. These embodiments are described in sufficient detail to allow those skilled in the art to practice the present invention.

In addition, throughout the detailed description and claims of the present invention, the term "comprising" and variations thereof are not intended to exclude other technical features, additions, components, or steps. Other objectives, advantages, and characteristics of the present invention will be appreciated by those skilled in the art from some of this specification and the practice of the present invention. The following examples and the accompanying drawings are provided by way of illustration and are not intended to limit the present invention.

In addition, the present invention encompasses all possible combinations of the embodiments indicated herein. It should be understood that various embodiments of the present invention, although different, are not necessarily mutually exclusive. For example, specific forms, structures, and characteristics described herein in connection with one embodiment may be implemented within other embodiments without departing from the spirit and scope of the present invention. In addition, it should be understood that the location or arrangement of individual components within each disclosed embodiment may be modified without departing from the scope of the present invention. The following detailed description, therefore, is not to be taken in a limiting sense, and the scope of the present invention is defined only by the appended claims, appropriately interpreted, along with the full range of equivalents to which the claims are entitled. In the drawings, similar numerals refer to the same or similar functionality throughout the several views.

Unless otherwise indicated or clearly contradicted by context in this specification, an item referred to as singular encompasses a plurality of things unless otherwise required in that context. In addition, in describing the present invention, when a detailed description of related known configurations or functions is determined to obscure the gist of the present invention, the detailed description thereof will be omitted.

Hereinafter, exemplary embodiments of the present invention will be described in detail with reference to the accompanying drawings so as to allow those skilled in the art to which the present invention pertains to easily practice the present invention.

FIG. 1 is a schematic block diagram illustrating a test apparatus and a device under test (DUT) according to one embodiment of the present invention.

As shown in FIG. 1, a test apparatus 100 according to one embodiment of the present invention includes a clock generator 110 and a tester 120.

The clock generator 110 includes a clock source 111, a clock multiplier 112, and a phase converter 113.

The clock source 111 generates a system clock. The clock signal is a sawtooth wave signal in which zero and one digits are alternately repeated at regular periods. Here, a frequency of the system clock generated from the clock source 111 is less than a frequency of a clock used in a DUT 200. For example, the frequency of the system clock generated from the clock source 111 may be two or four times slower than the frequency of the clock used in the DUT 200. Since an objective of the present invention is to test a DUT operating at a relatively high speed using a test apparatus which operates at a relatively low speed, it is assumed that the operating frequency of the test apparatus is always slower than the operating frequency of the DUT.

The clock multiplier 112 changes the frequency of the clock generated from the clock source 111 by integer multiplication. In a specific embodiment, the clock multiplier 112 may output a frequency obtained by multiplying the frequency of the clock generated from the clock source 111 by two or four. Here, a multiplication number used by the clock multiplier 112 may be determined on the basis of the operating frequency of the DUT 200 and the operating frequency of the test apparatus 100.

The phase converter 113 converts a phase of the system clock output from the clock source 111. The phase converted by the phase converter 113 may be determined according to the multiplication number of the clock multiplier 112.

For example, when the clock multiplier 112 changes the operating frequency twice, the phase converter 113 may output a first system clock having an unshifted phase and a second system clock having a phase shifted by 180 degrees. As another example, when the clock multiplier 112 changes the operating frequency four times, the phase converter 113 may output a first system clock having an unshifted phase, a second system clock having a phase shifted by 90 degrees, a third system clock having a phase shifted by 180 degrees, and a fourth system clock having a phase shifted by 270 degrees.

The tester 120 of the test apparatus 100 according to one embodiment of the present invention includes a test pattern comparator 121. The test pattern comparator 121 performs a test by capturing data from the DUT 200 according to the system clock output from the clock generator 110 and comparing the captured data with pre-stored data. Thus, the tester 120 may further include a memory (not shown) which stores comparison data for the performance of the test.

An operation of the test apparatus 100 shown in FIG. 1 will be described in brief. The clock generator 110 applies a first clock CK1 to the DUT 200 and a second clock CK2 to the tester 120. Here, the first clock CK1 may be a clock of which an operating frequency is increased through the clock multiplier 112, and the second clock CK2 may be a clock of which a phase is shifted according to the multiplication number of the clock multiplier 112. Second clocks of which phases are shifted by the phase converter 113 may be sequentially applied to the tester 120 according to a test order. In addition, the test pattern comparator 121 collects test patterns from the DUT 200 according to the second clocks.

Figure 2:
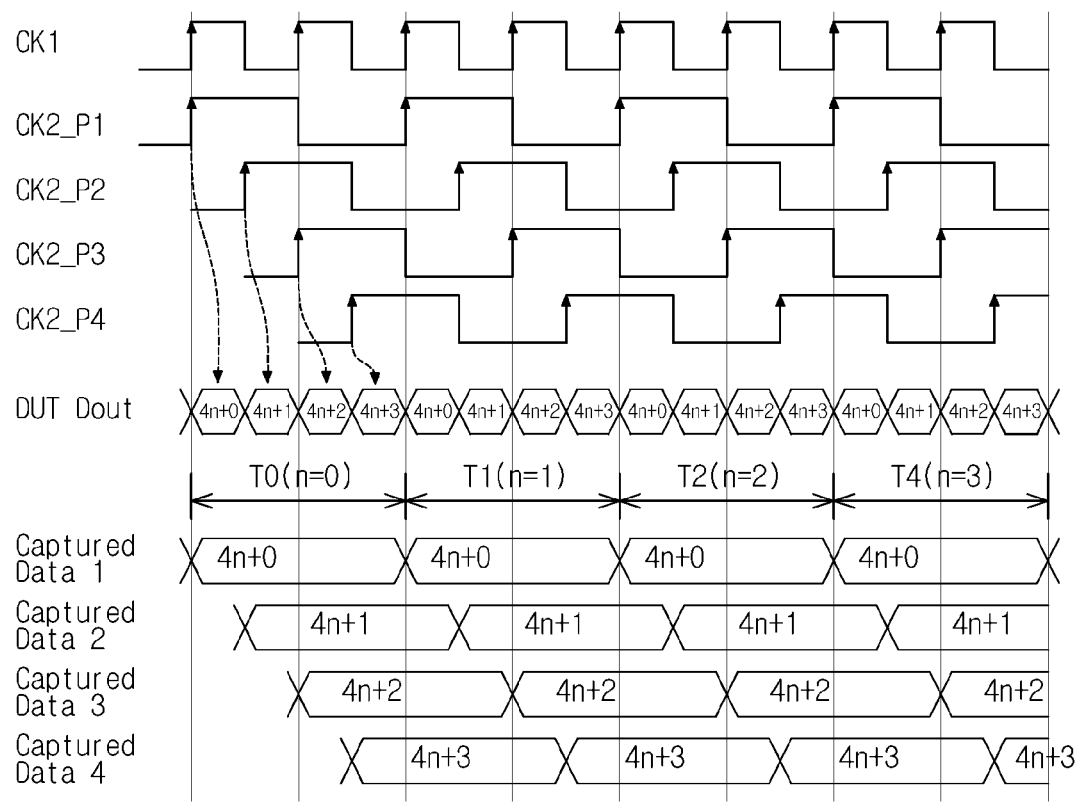
FIG. 2 is a waveform diagram illustrating outputs when the test apparatus is applied to the DUT according to one embodiment of the present invention.

FIG. 2 is a waveform diagram illustrating outputs when the test apparatus is applied to the DUT according to another embodiment of the present invention.

As described above, the first clock CK1 is a clock applied to the DUT 200. In addition, the second clock CK2 is a clock applied to the tester 120. As illustrated in FIG. 2, the clock generator 110 applies the second clock CK2, which has a cycle twice that of the first clock CK1, to the tester 120. Here, the second clock CK2 is a combination of clocks CK2_P1, CK2_P2, CK2_P3, and CK2_P4 which are shown in the waveform diagram and is formed of the clocks having the same cycle and different phases. The clocks CK2_P2, CK2_P3, and CK2_P4 are clocks having phases shifted from a phase of the clock CK2_P1 by 90 degrees, 180 degrees, and 270 degrees, respectively.

The tester 120 collects data four times. In other words, data at a position 4n+0 is collected and compared by applying the clock CK2_P1 in a first test, data at a position 4n+1 is collected and compared by applying the clock CK2_P2 in a second test, data at a position 4n+2 is collected and compared by applying the clock CK2_P3 in a third test, and data at a position 4n+3 is collected and compared by applying the clock CK2_P4 in a fourth test.

The reason for collecting the data four times is that the operating speed of the test apparatus 100 is ¼ of the operating speed of the DUT 200. In other words, the DUT 200 operates according to the first clock CK1 to output the pieces of data 4n+0, 4n+1, 4n+2, and 4n+3. However, since the operating speed of the test apparatus 100 is four times slower than the operating speed of the DUT 200, the pieces of data at the positions 4n+0, 4n+1, 4n+2, and 4n+3 output from the DUT 200 cannot be synchronized and collected in real time.

Therefore, the test apparatus 100 according to one embodiment of the present invention sequentially applies a plurality of clocks having different phases to the tester 120 and collects pieces of data output from the DUT 200 four times.

In the above described manner, even when the operating speed of the test apparatus 100 is slower than the operating speed of the DUT 200, all pieces of data output from the DUT 200 may be collected and compared only by shifting phases of clocks and sequentially applying the clocks without implementing a plurality of test pattern comparators.

In this case, there is a problem of being disadvantageous in a test time. However, it is possible to solve a problem of cost which may occur due to an excessive enlargement of the test apparatus. In addition, as compared to a large enterprise, since the number of devices to be tested is relatively small in a relatively small enterprise, even when there is a disadvantage in the test time, the benefit from the cost becomes relatively larger and thus the present invention may have a greater meaning.

Figure 3:
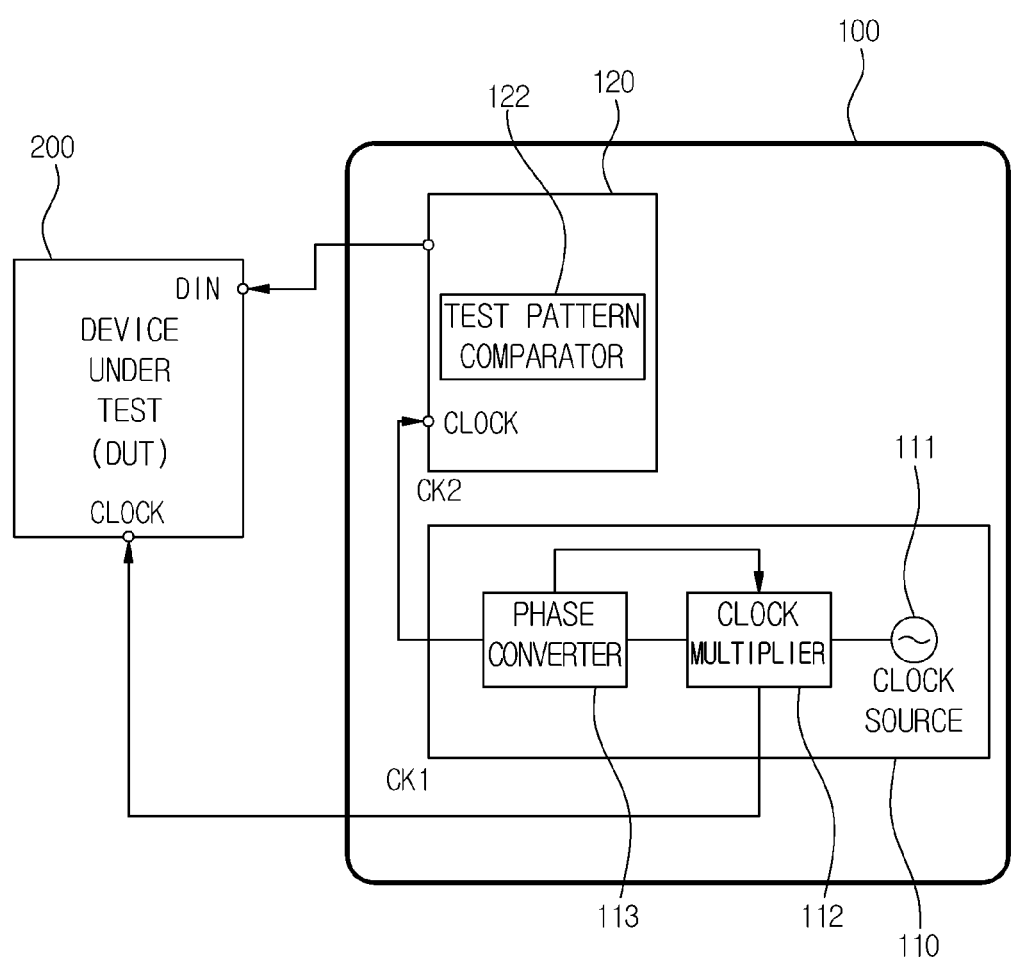
FIG. 3 is a schematic block diagram illustrating a test apparatus and a DUT according to another embodiment of the present invention.

FIG. 3 is a schematic block diagram illustrating a test apparatus and a DUT according to another embodiment of the present invention.

Since a component described in FIG. 1 among components shown in FIG. 3 is the same as the component of FIG. 1, a detailed description thereof will be omitted herein and replaced with the description of FIG. 1.

As shown in FIG. 3, a test apparatus 100 according to another embodiment of the present invention includes a clock generator 110 and a tester 120. A configuration and a function of the clock generator 110 are the same as those described in FIG. 1.

The tester 120 may include a test pattern generator 122. The test pattern generator 122 generates a test pattern according to a second clock CK2 being applied and applies the generated test pattern to the DUT 200. Thus, the tester 120 may further include a memory (not shown) which stores the generated test pattern.

An operation of the test apparatus 100 shown in FIG. 3 will be described in brief. The clock generator 110 applies a first clock CK1 to the DUT 200 and the second clock CK2 to the tester 120. Here, the first clock CK1 may be a clock of which an operating frequency is increased through the clock multiplier 112, and the second clock CK2 may be a clock of which a phase is shifted according to the multiplication number of the clock multiplier 112. Second clocks of which phases are shifted by the phase converter 113 may be sequentially applied to the tester 120 according to a test order. In addition, the test pattern generator 122 applies the test pattern to the DUT 200 according to the second clock CK2.

Figure 4:
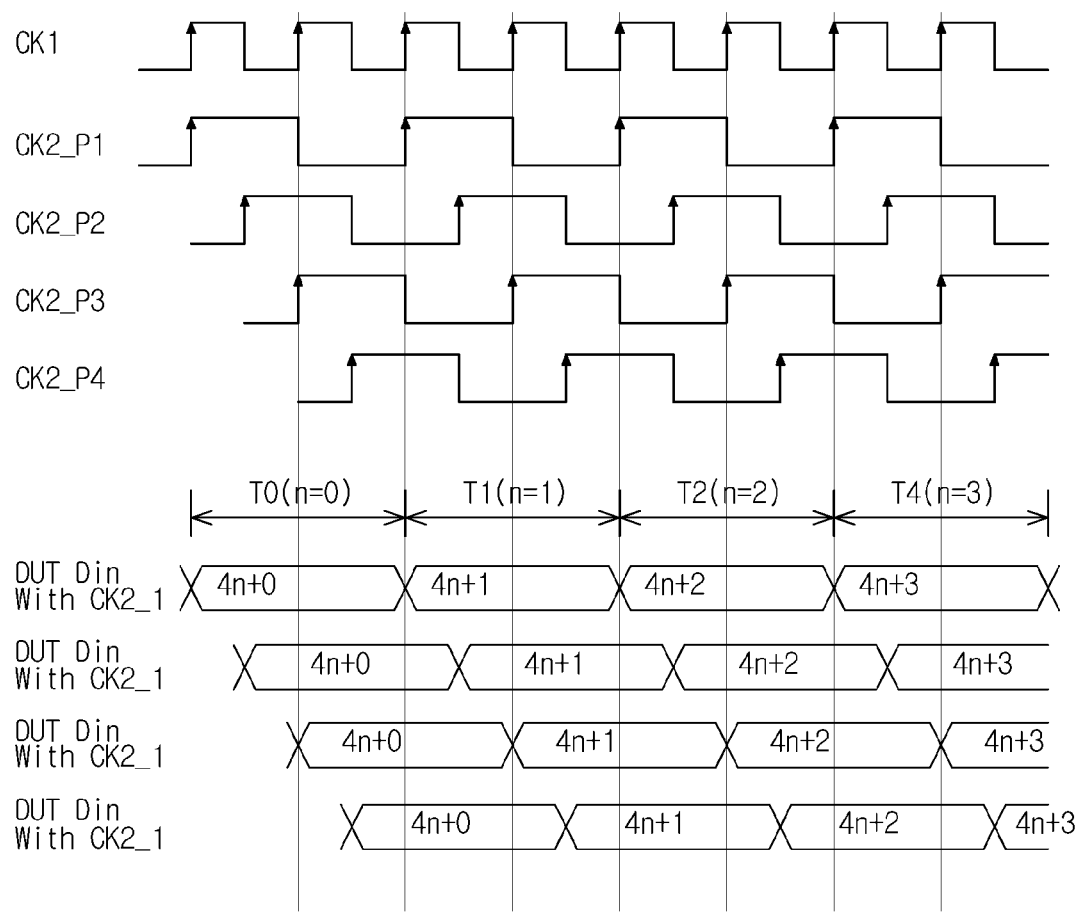
FIG. 4 is a waveform diagram illustrating outputs when the test apparatus is applied to the DUT according to another embodiment of the present invention.

FIG. 4 is a waveform diagram illustrating outputs when the test apparatus is applied to the DUT according to another embodiment of the present invention.

As described above, the first clock CK1 is a clock applied to the DUT 200. In addition, the second clock CK2 is a clock applied to the tester 120. As illustrated in FIG. 2, the clock generator 110 applies the second clock CK2, which has a cycle twice that of the first clock CK1, to the tester 120. Here, the second clock CK2 is a combination of clocks CK2_P1, CK2_P2, CK2_P3, and CK2_P4 which are shown in the waveform diagram and is formed of the clocks having the same cycle and different phases. The clocks CK2_P2, CK2_P3, and CK2_P4 are clocks having phases shifted from a phase of the clock CK2_P1 by 90 degrees, 180 degrees, and 270 degrees, respectively.

The tester 120 applies the test pattern four times according to the second clock CK2. In other words, the test pattern is applied to a position 4n+0 by applying the clock CK2_P1 in a first test, the test pattern is applied to the position 4n+1 by applying the clock CK2_P2 in a second test, the test pattern is applied to the position 4n+2 by applying the clock CK2_P3 in a third test, and the test pattern is applied to the position 4n+3 by applying the clock CK2_P4 in a fourth test.

The reason for applying the test pattern four times is that the operating speed of the test apparatus 100 is ¼ the operating speed of the DUT 200. In other words, the DUT 200 operates according to the first clock CK1 and the test apparatus 100 receives the pieces of data at the positions 4n+0, 4n+1, 4n+2, and 4n+3. However, since the operating speed of the test apparatus 100 is four times slower than the operating speed of the DUT 200, the test apparatus 100 cannot be synchronized with the operation of the DUT 200 in real time to apply the test patterns to the DUT 200.

Therefore, the test apparatus 100 according to one embodiment of the present invention applies the test patterns to the DUT 200 four times by sequentially applying a plurality of clocks having different phases to the tester 120.

In the above described manner, even when the operating speed of the test apparatus 100 is slower than the operating speed of the DUT 200, all the test patterns may be applied according to the operating speed of the DUT 200 only by shifting phases of clocks and sequentially applying the clocks without implementing a plurality of pattern generators.

In a further embodiment, the tester 120 of the test apparatus 100 may include both the test pattern comparator 121 and the test pattern generator 122. Alternatively, the present invention may be characterized by including one test pattern comparator 121 and one test pattern generator 122. In other words, the test pattern comparator and the test pattern generator of the present invention may collect only one piece of data at a time or apply only one test pattern at a time.

Specifically, unlike the related art, the test according to the present invention may be sequentially performed by shifting only a phase using only one test pattern comparator and only one test pattern generator. Thus, as compared with the related art, it is possible to reduce a size of the test apparatus and decrease costs by as much as several tens of times.

Figure 5:
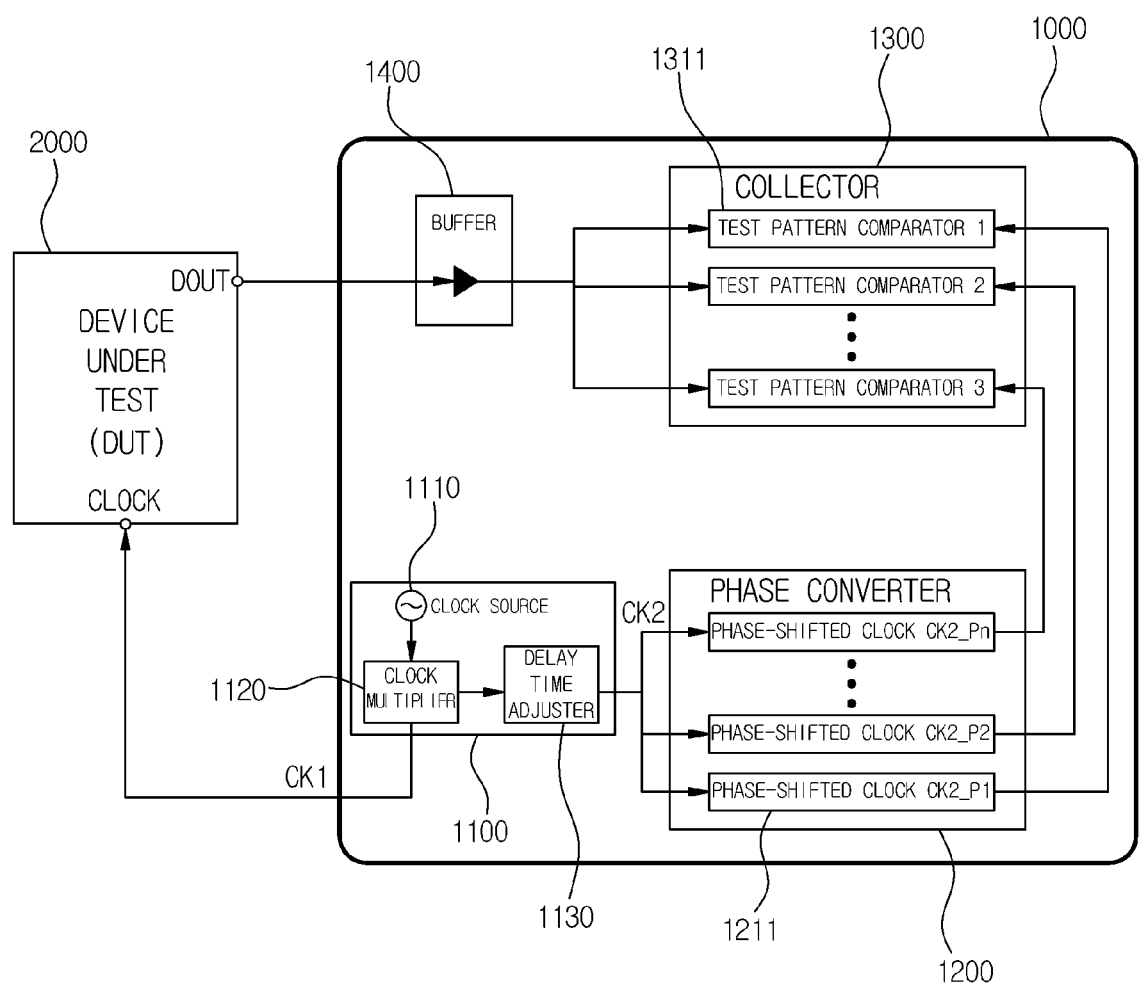
FIG. 5 is a block diagram illustrating a test apparatus according to still another embodiment of the present invention.

FIG. 5 is a block diagram illustrating a test apparatus according to still another embodiment of the present invention.

As shown in FIG. 5, a test apparatus 1000 according to still another embodiment of the present invention includes a clock generator 1100, a collector 1300, a phase converter 1200, and a buffer 1400.

The clock generator 1100 includes a clock source 1110, a clock multiplier 1120, and a delay time adjuster 1130.

The clock source 1110 applies a first clock CK1 to a DUT 2000 and a second clock CK2 to the phase converter 1200. Here, the first clock CK1 is a clock having an operating frequency which is increased through the clock multiplier 1120.

Similar to the above description, the clock multiplier 1120 changes the frequency of the clock generated from the clock source 1110 by integer multiplication.

The delay time adjuster 1130 appropriately delays the clock generated from the clock source 1110. In the embodiment of FIG. 5, the delay time adjuster 1130 is illustrated as being located in front of the phase converter 1200. However, this is merely one example, and the delay time adjuster 1130 may be located behind the phase converter 1200.

The phase converter 1200 converts a phase of a system clock output from the clock source 1110. The phase converter 1200 may include a plurality of phase conversion modules 1211, . . . , and 121n which may simultaneously convert the phase of the system clock output from the clock source 1110 into a plurality of different phases.

In other words, the phase converter 1200 may simultaneously output a plurality of system clocks having different phases. The number of the system clocks having different phases output from the phase converter 1200 may be determined according to a multiplication number of the clock multiplier 1120.

The collector 1300 captures data output from the DUT 2000. The collector 1300 includes a plurality of test pattern comparators 1311, . . . , and 131n. The plurality of test pattern comparators 1311, . . . , and 131n receive a plurality of clocks having different phases output from the phase converter 1200 and perform a test by comparing data output from the DUT 2000 with pre-stored data. The collector 1300 may further include a memory (not shown) which stores comparison data for the performance of the test.

The buffer 1400 temporarily stores a signal output from the DUT 2000 and then transmits the signal to the collector 1300. The buffer 1400 prevents a delay of the signal output from the DUT 2000 and distortion of a waveform of the signal. Here, the buffer 1400 is not an essential component in the present invention, and it is possible to implement the present invention without the buffer 1400.

An operation of the test apparatus 1000 shown in FIG. 5 will be described in brief. The clock generator 1100 applies the first clock CK1 to the DUT 2000 and applies the second clock CK2 to the phase converter 1200. Here, the first clock CK1 may be a clock having an operating frequency which is increased through the clock multiplier 1120, and the second clock CK2 may be converted into a plurality of clocks having different phases in the phase converter 1200 and then applied to the collector 1300. In addition, the collector 1300 collects and tests a plurality of pieces of data from the DUT 2000 according to the plurality of clocks having different phases converted in the phase converter 1200.

Consequently, the test apparatus described in FIG. 5 includes the plurality of test pattern comparators, and the clocks having different phases are simultaneously applied to the plurality of test pattern comparators so that a test may be performed. Therefore, the test apparatus described in FIG. 1 may prevent a loss in time, which is inevitably caused due to sequential application of clocks having different phases to a single test pattern comparator, and increase an overall test speed.

Figure 6:
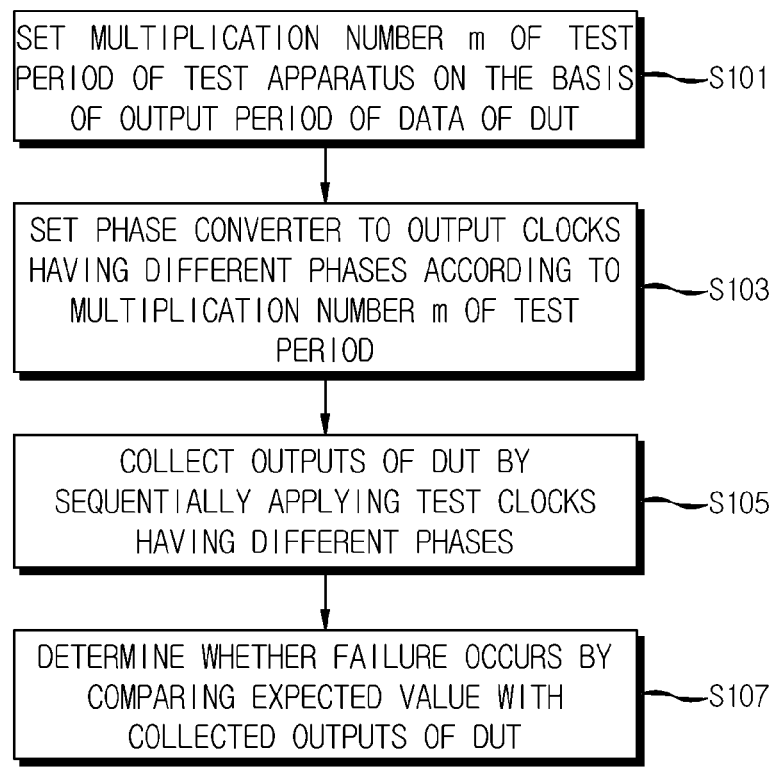
FIG. 6 is a flowchart illustrating an operation of the test apparatus according to one embodiment of the present invention.

FIG. 6 is a flowchart illustrating an operation of the test apparatus according to one embodiment of the present invention.

The test apparatus sets a multiplication number of a test period on the basis of an output period of a DUT (S101). Specifically, the test apparatus sets the multiplication number of the test period on the basis of an operating frequency of the DUT and an operating frequency of the test apparatus. For example, when the operating frequency of the DUT is four times faster than the operating frequency of the test apparatus, the test apparatus may set the multiplication number of the test period as four. Here, the multiplication number of the test period may not be fixed and may be changed according to the operating frequency of the test apparatus and the operating frequency of the DUT.

The test apparatus sets a phase converter to output clocks having different phases according to the multiplication number of the test period (S103). For example, when the multiplication number of the test period is four, the test apparatus may be set to convert the phase of the clock into zero degrees, 90 degrees, 180 degrees, or 270 degrees. Alternatively, when the multiplication number of the test period is two, the test apparatus may be set to convert the phase of the clock into zero degrees or 180 degrees.

The test apparatus collects outputs of the DUT by sequentially applying test clocks having different phases, which are output from the phase converter according to the setting, to a tester (S105). In a specific embodiment, when the multiplication number of the test period is four, the test apparatus collects all outputs of the DUT by sequentially applying clocks having phases, which are converted into zero degrees, 90 degrees, 180 degrees, and 270 degrees, to the tester.

Here, as described above, since the operating frequency of the DUT is four times faster than the operating frequency of the test apparatus, all pieces of data may be collected from the DUT by sequentially applying clocks having four different phases.

The test apparatus determines whether a failure occurs by comparing an expected value with the collected outputs of the DUT (S107). Specifically, the test apparatus may collect all pieces of data of the DUT operating relatively faster than the test apparatus by sequentially applying the clocks having different phases, and the test apparatus may determine whether a failure occurs in the DUT by comparing the collected pieces of data with a pre-stored expected value.

Based on the above description of the embodiments, those skilled in the art may definitely understand that the present invention may be achieved through a combination of software modules and hardware modules. Objects of the technical solution of the present invention or parts contributing to the related art may be implemented in the form of program commands, which are capable of being executed through various components, and may be recorded in a machine-readable recording medium.

The machine-readable recording medium may include program commands, data files, data structures, and the like alone or in a combination thereof. The program commands recorded in the machine-readable recording medium may be specially designed and configured for the present invention or may be available to those skilled in the computer software.

Examples of the machine-readable recording media include magnetic media such as a hard disk, a floppy disk, and a magnetic tape, optical recording media such as a compact disc read only memory (CD-ROM) and a digital versatile disc (DVD), a magneto-optical medium such as a floptical disk, and hardware devices specifically configured to store and execute program commands, such as a read only memory (ROM), a random access memory (RAM), a flash memory, and the like. Examples of the program commands include machine language codes generated by a compiler, as well as high-level language codes which are executable by a processor using an interpreter or the like.

The measurement apparatus according to the present invention, in particular, a processor of the measurement apparatus, may be configured to include or execute one or more software modules, which are described above, to perform the processing according to the present invention.

Since the measurement apparatus according to the present invention is capable of including memories such as ROM/RAM for storing the program commands, the processor configured to execute commands stored in the memories may include a central processing unit (CPU) or a graphics processing unit (GPU) and, as described above, the processor may include a communication part capable of exchanging a signal with an external device. In addition, the measurement apparatus according to the present invention may include a keyboard, a mouse, and other external input devices for receiving commands written by developers.

The invention claimed is:

1. A test apparatus operating at an operating frequency that is lower than an operating frequency of a device under test (DUT), the test apparatus comprising:
   a clock source which generates a clock according to the operating frequency of the test apparatus;
   a clock multiplier configured to multiply the generated clock by a multiplication number m which is set according to the operating frequency of the DUT and output a first clock for the DUT;
   a phase converter configured to shift a phase of the generated clock according to the multiplication number m and output a plurality of second clocks (CK2_P1, CK2_P2, ..., CK2_Pm) having different phases; and
   a test pattern comparator configured to sequentially collect and compare pieces of data from the DUT by sequentially applying the plurality of second clocks (CK2_P1, CK2_P2, ..., CK2_Pm) having different phases,
   wherein, the plurality of second clocks (CK2_P1, CK2_P2, ..., CK2_Pm) are sequentially applied to the same test pattern comparator which operates at the operating frequency of the test apparatus that is lower than the operating frequency of the DUT, and
   the test pattern comparator compares all pieces of data from the DUT by repeating the comparison of each piece of data from the DUT m times using each of the plurality of second clocks (CK2_P1, CK2_P2, ..., CK2_Pm) sequentially.

2. The test apparatus of claim 1, wherein a tester determines whether the DUT fails by comparing the collected pieces of data with a pre-stored expected value.

3. A test apparatus operating at an operating frequency that is lower than an operating frequency of a device under test (DUT), the test apparatus comprising:
   a clock source which generates a clock according to the operating frequency of the test apparatus;
   a clock multiplier configured to multiply the generated clock by a multiplication number m which is set according to the operating frequency of the DUT and output a first clock for the DUT;
   a phase converter configured to shift a phase of the generated clock according to the multiplication number m and output a plurality of second clocks (CK2_P1, CK2_P2, ..., CK2_Pm) having different phases; and
   a test pattern generator configured to sequentially apply pieces of test patterns to the DUT by sequentially applying the plurality of second clocks (CK2_P1, CK2_P2, ..., CK2_Pm) having different phases,
   wherein, the plurality of second clocks (CK2_P1, CK2_P2, ..., CK2_Pm) are sequentially applied to the same test pattern generator which operates at the operating frequency of the test apparatus that is lower than the operating frequency of the DUT, and
   the test pattern generator applies all pieces of test patterns to the DUT by repeating the applying of each piece of test patterns to the DUT m times using each of the plurality of second clocks (CK2_P1, CK2_P2, ..., CK2_Pm) sequentially.

4. A test apparatus operating at an operating frequency that is lower than an operating frequency of a device under test (DUT), the test apparatus comprising:
   a clock source which generates a clock according to the operating frequency of the test apparatus;
   a clock multiplier configured to multiply the generated clock by a multiplication number m which is set according to the operating frequency of the DUT and output a first clock for the DUT;
   a phase converter configured to shift a phase of the generated clock according to the multiplication number m and output a plurality of second clocks (CK2_P1, CK2_P2, ..., CK2_Pm) having different phases;
   a test pattern comparator configured to sequentially collect and compare pieces of data from the DUT by sequentially applying the plurality of second clocks (CK2_P1, CK2_P2, ..., CK2_Pm) having different phases; and
   a test pattern generator configured to sequentially apply pieces of test patterns to the DUT by sequentially applying the plurality of second clocks (CK2_P1, CK2_P2, ..., CK2_Pm) having different phases,
   wherein, the plurality of second clocks (CK2_P1, CK2_P2, ..., CK2_Pm) are sequentially applied to the same test pattern comparator which operates at the operating frequency of the test apparatus that is lower than the operating frequency of the DUT,
   the test pattern comparator compares all pieces of data from the DUT by repeating the comparison of each piece of data from the DUT m times using each of the plurality of second clocks (CK2_P1, CK2_P2, ..., CK2_Pm) sequentially, the plurality of second clocks (CK2_P1, CK2_P2, ..., CK2_Pm) are sequentially applied to the same test pattern generator which operates at the operating frequency of the test apparatus that is lower than the operating frequency of the DUT, and the test pattern generator applies all pieces of test patterns to the DUT by repeating the applying of each piece of test patterns to the DUT m times using each of the plurality of second clocks (CK2_P1, CK2_P2, ..., CK2_Pm) sequentially.

\* \* \* \* \*